United States Patent
Singer et al.

(10) Patent No.: US 6,611,574 B2
(45) Date of Patent: Aug. 26, 2003

(54) ILLUMINATION SYSTEM WITH REDUCED HEAT LOAD

(75) Inventors: Wolfgang Singer, Aalen (DE); Wilhelm Ulrich, Aalen (DE); Martin Antoni, Aalen (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 0 days.

(21) Appl. No.: 10/040,175

(22) Filed: Oct. 25, 2001

(65) Prior Publication Data

US 2002/0141071 A1 Oct. 3, 2002

(30) Foreign Application Priority Data

Oct. 27, 2000 (DE) .......................... 100 53 587
Jan. 5, 2001 (DE) .......................... 201 00 123

(51) Int. Cl.[7] .............................................. G21K 5/00
(52) U.S. Cl. ................................... 378/34; 378/84
(58) Field of Search ................................ 378/34, 84

(56) References Cited

U.S. PATENT DOCUMENTS

| | | | |
|---|---|---|---|
| 5,339,346 A | 8/1994 | White | 378/34 |
| 5,361,292 A | 11/1994 | Sweatt | 379/34 |
| 5,581,605 A | 12/1996 | Murakami et al. | 378/84 |
| 5,737,137 A | 4/1998 | Cohen et al. | 359/859 |
| 6,198,793 B1 * | 3/2001 | Schultz et al. | 378/34 |
| 6,400,794 B1 * | 6/2002 | Schultz et al. | 378/34 |
| 6,438,199 B1 * | 8/2002 | Schultz et al. | 378/34 |

FOREIGN PATENT DOCUMENTS

| | | |
|---|---|---|
| DE | 19903807 A1 | 11/1999 |
| EP | 0939341 A2 | 9/1999 |

* cited by examiner

*Primary Examiner*—Drew A. Dunn
*Assistant Examiner*—Irakli Kiknadze
(74) *Attorney, Agent, or Firm*—Ohlandt, Greeley, Ruggiero & Perle, LLP

(57) ABSTRACT

An illumination system for wavelengths $\leq 193$ run comprises (a) a first raster element upon which a light bundle emitted from a light source impinges, for producing a convergent light bundle having a focal point, and (b) a second raster element. The convergent light bundle impinges on the second raster element outside the focal point. There is also provided an illumination system for wavelengths $\leq 193$ nm, comprising (a) a first plurality of raster elements upon which a light bundle emitted from a light source impinges, for producing a plurality of convergent light bundles, where a member of the first plurality of raster elements produces a member of the plurality of convergent light bundles having a focal point, and (b) a second plurality of raster elements. The member of the plurality of convergent light bundles impinges on a member of the second plurality of raster elements outside the focal point.

18 Claims, 4 Drawing Sheets

ILLUMINATION SYSTEM WITH REDUCED HEAT LOAD

BACKGROUND OF THE INVENTION

1. Field of the Invention

The present invention relates to an illumination system, and more particularly an illumination system for wavelengths ≦193 nm, such as that used for EUV lithography. The invention also relates to a method for reducing heat load, and a projection exposure apparatus comprising such an illumination system.

2. Description of the Prior Art

In order to be able to further reduce the line widths for electronic components, particularly in the submicron region, it is necessary to reduce the wavelengths of the light utilized for microlithograpy. With wavelengths smaller than 193 nm, for example, lithograpy with soft x-rays, so-called EUV lithography, is possible.

An illumination system suitable for EUV lithography should homogeneously, i.e., uniformly, illuminate a field used in EUV-lithography, particularly a ring field of an objective, with as few reflections as possible. Furthermore, a pupil of the objective will be illuminated independently of the field up to a specific filling degree σ, and an exit pupil of the illumination system will lie in the entrance pupil of the objective.

An illumination system for a lithography device, which uses EUV rays, has been made known from U.S. Pat. No. 5,339,346. For uniform illumination in a reticle plane and filling of a pupil, U.S. Pat. No. 5,339,346 proposes a condenser, which is constructed as a collector lens and comprises at least four mirror facets, which are arranged in pairs and symmetrically. A plasma light source is used as a light source.

In U.S. Pat. No. 5,737,137, an illumination system with a plasma light source comprising a condenser mirror is shown. In U.S. Pat. No. 5,737,137 an illumination of a mask or a reticle is achieved by means of spherical mirrors.

U.S. Pat. No. 5,361,292 shows an illumination system, in which a plasma light source is used. The plasma light source is point-like and is imaged into a ring-shaped illuminated surface by means of a condenser, which has five aspheric, eccentrically arranged mirrors. The ring-shaped illuminated surface is then imaged in an entrance pupil by means of a special sequence of grazing-incidence mirrors.

An illumination system is known from U.S. Pat. No. 5,581,605 in which a photon radiator is partitioned into a plurality of secondary light sources by means of a honeycomb condenser. A regular or uniform illumination is achieved in this way in a reticle plane. The imaging of a reticle on a wafer to be exposed is achieved with conventional reduction optics. Exactly one rastered mirror is arranged in the illumination beam path.

EP 0 939,341 shows a Köhler illumination system for wavelengths <200 nm, also particularly for the EUV range, with a first optical integrator comprising a plurality of first raster elements and a second optical integrator, comprising a plurality of second raster elements.

Another EUV illumination system has been made known from DE 199 03,807 A1. The system according to DE 199 03,807 A1 comprises two mirrors or lenses with raster elements. Such systems are known as double-faceted EUV illumination systems. The disclosure content of DE 199 03,807 A1 is incorporated to the full extent in the present application.

The construction principle of a double-faceted EUV illumination system is shown in DE 199 03,807 A1. An illumination in an exit pupil of the illumination system according to DE 199 03,807 is determined by an arrangement of the raster elements on the second mirror.

A disadvantage of the system known from DE 199 03,807 is that with field raster 5 elements, a light source with a diameter X is imaged directly into a pupil raster element. At the site of the pupil raster elements, in the ideal case, a stigmatic image of the light source is formed. With a small etendue of the light source, very small light-source images are formed on the pupil raster elements, so that a locally intense, concentrated, very high thermal load occurs therein.

Generally, the etendue or the phase space volume of the illumination optics is given by $$(E) \text{ etendue} = BX \cdot BY \cdot \pi \cdot \vartheta^2 \cdot NA^2$$

wherein
BX: field width
BY: field length
NA: aperture of the imaging objective on the object side
$\vartheta$: degree of coherence.

With typical values of $BX \cdot BY = 8 \times 88$ mm$^2$, $NA = 0.0625$ and $\vartheta = 0.8$, an etendue of $E = 5.5$ mm$^2$ results. EUV light sources, such as a synchrotron light source, for example, have an etendue of approximately 0.001, thus smaller by a factor of 5500. In this respect, for example, reference is made to M. Antoni et al. "Illumination optics design for EUV lithography", Proc. SPIE, Vol. 4146, pp. 25–34 (2000). In such systems, the thermal load is distributed onto point-like light source images on a pupil raster element plate, whereby the overall power is reduced only slightly by the number of facet mirrors.

SUMMARY OF THE INVENTION

One object of the present invention is to provide a double-faceted illumination system, which is constructed as simply as possible and that has a reduced heat load on the second mirror or the second lens with raster elements, as well as a method for reducing the heat load on the second mirror with raster elements, sometimes referred to as "honeycombs", for such an illumination system.

The object is solved according to the invention for an illumination system for wavelengths ≦193 nm, particularly for EUV lithography, in that the heat load is reduced by shifting the raster elements of the second mirror or of the second lens out of the focus of the light bundles of the raster elements of the first mirror or first lens with raster elements. Due to the divergence of the light bundles, a light bundle becomes broader with increasing distance from the focal point or from the image position of the secondary light source.

Since the diameter of a light bundle increases proportionally to the aperture angle of the light bundle, the following is valid:

$$\Delta D = 2\Delta z \cdot \tan(\alpha) \approx 2\Delta z \cdot \sin(\alpha) \approx 2\Delta z \cdot NA$$

with $\Delta D$=change of the diameter of the light bundle
$\Delta z$=defocusing of the second raster elements
$\alpha$=half of the aperture angle of the light bundle
NA=numerical aperture of the light bundle For a light bundle with diameter $D(z=0)=X$, the following is valid:

$$D(z) \approx X + 2\Delta z \cdot NA$$

If one would like to obtain a predetermined filling degree of the second raster elements of the second mirror, the so-called pupil raster elements, then the amount of defocusing amounts to:

$$\Delta z \approx \frac{\text{filling degree}_{target} \cdot \varnothing_{pupilhoneycomb} - X}{2 \cdot NA} = $$

$$\frac{\text{filling degree}_{target} - \text{filling degree}_{z=0}}{2 \cdot NA} \varnothing_{pupilhoneycomb}$$

A defocusing $\Delta z$ can be achieved by a change of the refractive power of the first raster elements or by a shifting of the second raster elements, whereby in the latter case, additional system data must also be fitted. Defocusing can occur to any extent, as long as the images of the light source, the so called secondary light sources, are not larger then the second raster elements.

In another advantageous embodiment, for achieving a particularly small local heat load, the amount of defocusing is determined in such a way that the extension of the secondary light sources is smaller than the size of the pupil raster elements, whereby the width of the non-illuminated edge region is less than 10% of the minimal diameter of the pupil raster elements. A non-illuminated region is a region in which the intensity is <10% of the maximum intensity of the secondary light source.

By changing the points of incidence of the light channels passing through from the light source to the exit pupil, in a preferred embodiment, a specified illumination can be established in the exit pupil. Any desired distribution can be produced by such an adjustment of the light distribution in the exit pupil, and light losses, which occur, for example, when diaphragms are used for solving this problem, are avoided.

In systems according to the invention, with two optical elements with raster elements, the form of the pupil raster elements is adapted to the form of the secondary light sources and thus differs from the form of the first raster elements, the so called field honeycombs, also referred to as field raster elements. The pupil honeycombs, also referred to as pupil raster elements, are elliptical or round in a preferred embodiment, although the light source is configured as round.

In a preferred form of embodiment, additional optical elements, such as field mirrors, are arranged downstream to the mirrors with raster elements, and they serve for the purpose of imaging the pupil plane in the exit pupil of the illumination system, which coincides with the entrance pupil of the projection objective. Furthermore these elements form the ring field.

It is particularly preferred that the optical elements comprise grazing-incidence mirrors with angles of incidence $\leq 15°$. In order to minimize the light losses associated with each reflection, it is advantageous if the number of field mirrors is kept small. Particularly preferred are forms of embodiment with at most three field mirrors.

Laser-plasma, plasma or pinch-plasma sources as well as other EUV light sources are conceivable as light sources for EUV radiation.

Other EUV light sources are, for example, synchrotron radiation sources. Synchrotron radiation is emitted, if relativistic electrons are deflected in a magnetic field. The synchrotron radiation is emitted tangentially to the electron path.

BRIEF DESCRIPTION OF THE DRAWINGS

The invention will be described below on the basis of the drawings.

Here.

DESCRIPTION OF THE INVENTION

Figure 1:
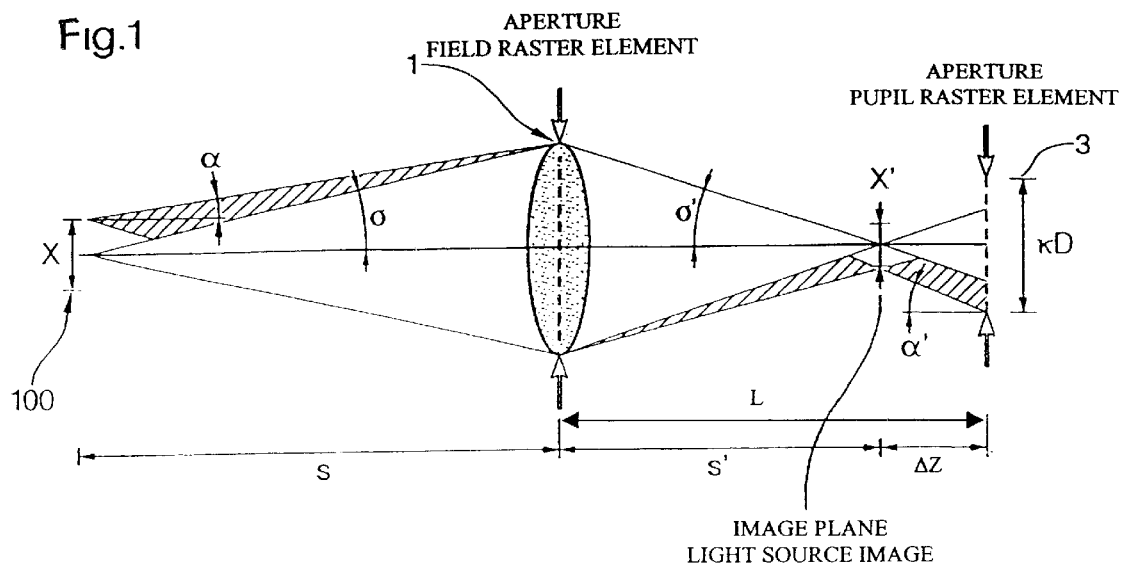
FIG. 1 is a schematic drawing showing principal components for deriving the formulas for defocusing by means of changing the refractive power of the first raster elements in refractive representation.

A schematic drawing showing the principal components for deriving the formulas for defocusing by changing the refractive power of the first raster elements is shown in FIG. 1. As is shown in FIG. 1, the first raster elements have a positive optical power, thus providing a convergent light bundle with a focal point in the plane of the images of the light sources. FIG. 1 is shown in refractive representation. A person skilled in the art can transfer the parameters to the reflective optics necessary for exposure systems with wavelengths $\leq 193$ nm, particularly for EUV lithograpy, without inventive activity.

The principle components of the system shown in FIG. 1 include a light source 100, a first raster element, e.g., field raster element 1, and a second raster element, e.g., pupil raster element 3. If light source 100 has a diameter X, and if pupil raster element 3 has a diameter D and is filled with illumination to a ratio $\kappa$, then the distance between field raster element 1 and pupil raster element 3 must be selected suitably as $L=s'+\Delta z$. The following is valid:

$$\beta = \frac{s'}{s} = \frac{X'}{X} = \frac{\sin\sigma}{\sin\sigma'} \quad (1)$$

Thus the size of field raster element 1 is determined by the magnification of the imaging system arranged in the light path after field raster element 1. For example, assuming field raster element 1 is of a size FX×FY=2.8 mm×46 mm, it follows for an angle of aperture σ, as shown in FIG. 1:

$$\tan\sigma_x = \frac{FX}{2s} \text{ and } \tan\sigma_y = \frac{FY}{2s} \quad (2)$$

β: magnification of the field raster elements
FX: width of the field raster elements
FY: length of the field raster elements
s: distance between the object, e.g. the light source and the field raster elements, i.e. object intersection distance
s': distance between the field raster elements and the image of the object, e.g. the image of the light source, i.e. image intersection distance
σ: angle of aperture For the further derivation, only the y-component is necessary, since the y-component has a large divergence angle. In addition, tan σ can be set approximately equal to sin σ. The refractive power of field raster element 1 can be determined as follows, based on the definition of β.

The known imaging equation of the first order reads:

$$p_1 = -\frac{1}{f}x_0 + \frac{1}{\beta}p_0 \quad (3)$$

wherein:

$p_1$: optical direction cosine in the image space of the field raster element
$p_2$: optical direction cosine in the object space of the field raster element
f: focal length of the field raster element
β: magnification of the field raster element.

The object-side optical direction cosine $p_0$ of the upper aperture beam of the upper light source edge X/2 is given by:

$$p_0 = \sin\alpha \approx \tan\alpha = -\frac{(FY-X)}{2s} \quad (4)$$

and the image-side optical direction cosine $p_1$ of the assigned lower edge beam of the image of the upper edge of the light source is given by:

$$p_1 = \sin\alpha' = \tan\alpha' = -\frac{(FY + \kappa \cdot D)}{2L} \quad (5)$$

If s, L, D and X are given, then the refractive power of the field raster element is determined as follows.

With the magnification as a function of focal length and distance to the vertex of the surface:

$$\beta = \frac{f}{f+s}, \quad (6)$$

$$p_1 = -\frac{1}{f}x_0 + \frac{f+s}{f}p_0. \quad (7)$$

Solving for f and inserting Eq. (4) and (5), with $x_0$=X/2, the following results:

$$f = \frac{FY \cdot s \cdot L}{(FY + \kappa D)s - (FY - X)L}. \quad (8)$$

With the values:
s=1200 mm for the object intersection distance;
L=900 mm for the distance between the pupil raster element and the field raster element;
D=10 mm for the diameter of the pupil raster element;
X=3 mm for the diameter of the light source; and
κ=0.8 for the filling ratio.
For s, L, D, X, κ it follows that:
f=480.092 mm for the focal length of the first raster element;
R~−2f=−960.184 mm for the radius of the first raster element; and
Δz=99.744 mm for the displacement of the pupil raster element beyond the focal point (X') for defocusing of the pupil raster element.

A member of the convergent light bundle is characterized by a numerical aperture NA and has a diameter X' at a focal point. A member of the pupil raster element has a diameter D and is characterized by a defocusing Δz, wherein the defocusing Δz is given by:

$$\frac{0.1D - X'}{2 \cdot NA} < \Delta z < \frac{D - X'}{2 \cdot NA} \quad (9)$$

The illumination system is characterized by a distance s from the light source to the field raster elements, and a distance L from the field raster elements to sthe pupil raster elements. The light source has a diameter X, and a member of the pupil raster elements has a diameter D. A member of the field raster elements is characterized by an extension FY that describes a longer of two extensions of the member of field raster elements, and a focal distance f. The focal distance f lies within the following boundaries:

$$\frac{FY \cdot s \cdot L}{(FY + 0.5D) \cdot s - (FY - X) \cdot L} > f > \frac{FY \cdot s \cdot L}{(FY + D) \cdot s - (FY - X) \cdot L} \quad (10)$$

so that defocusing occurs.

Figure 2:
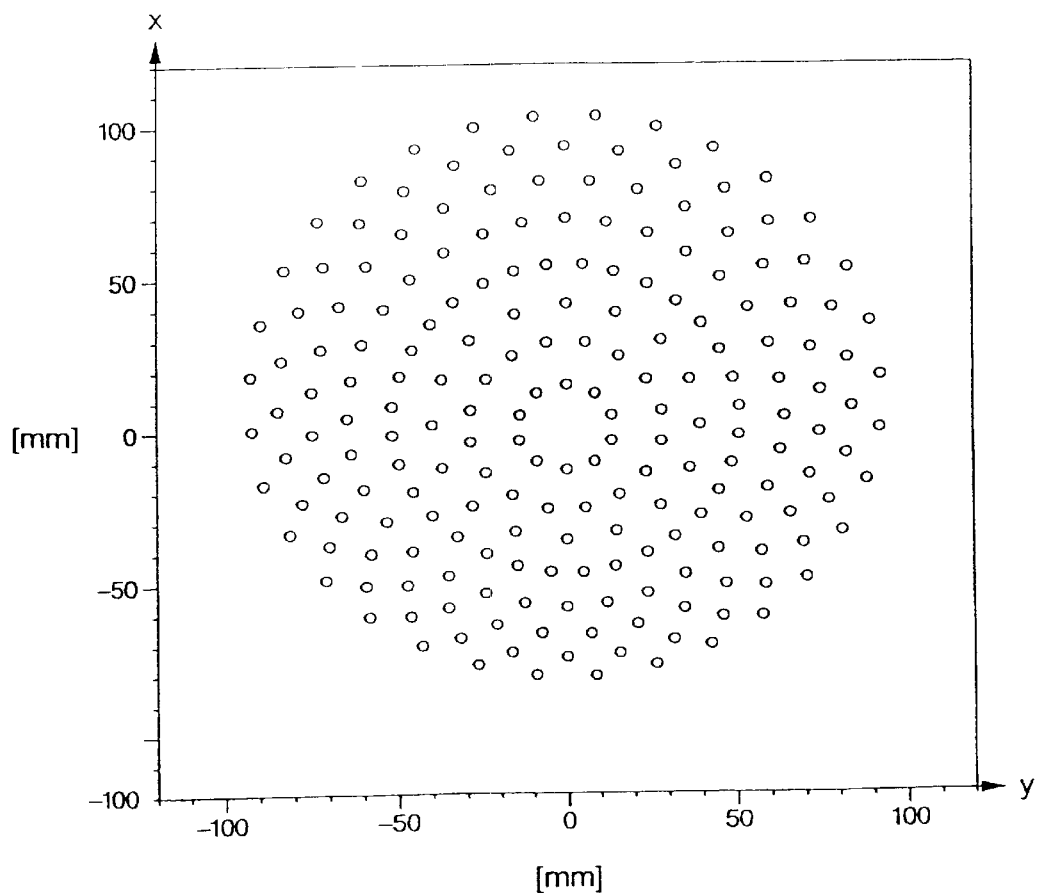
FIG. 2 shows the filling of the pupil raster element without defocusing.

FIG. 2 shows the illumination of a second optical element 104 (see FIG. 4) of a double faceted illumination system with a plurality of pupil raster elements for a source assumed to be spherical, without defocusing, having a diameter of 3 mm. A double faceted illumination system with a second optical element is shown, for example, in FIG. 4 or 5. The focal distance of the field raster elements is f=514.286 mm, and R=−1028.571 mm.

The collected aperture amounts to 0.09. The etendue is therefore:

$$E = \pi/4 \cdot X^2 \cdot \pi NA^2 \approx 0.2. \quad (11)$$

The etendue of the light source thus corresponds approximately to a $1/25^{th}$ part of the etendue, which could be collected. At the same time, the secondary light sources fill only approximately $1/25^{th}$ of the pupil raster element plate.

Figure 3:
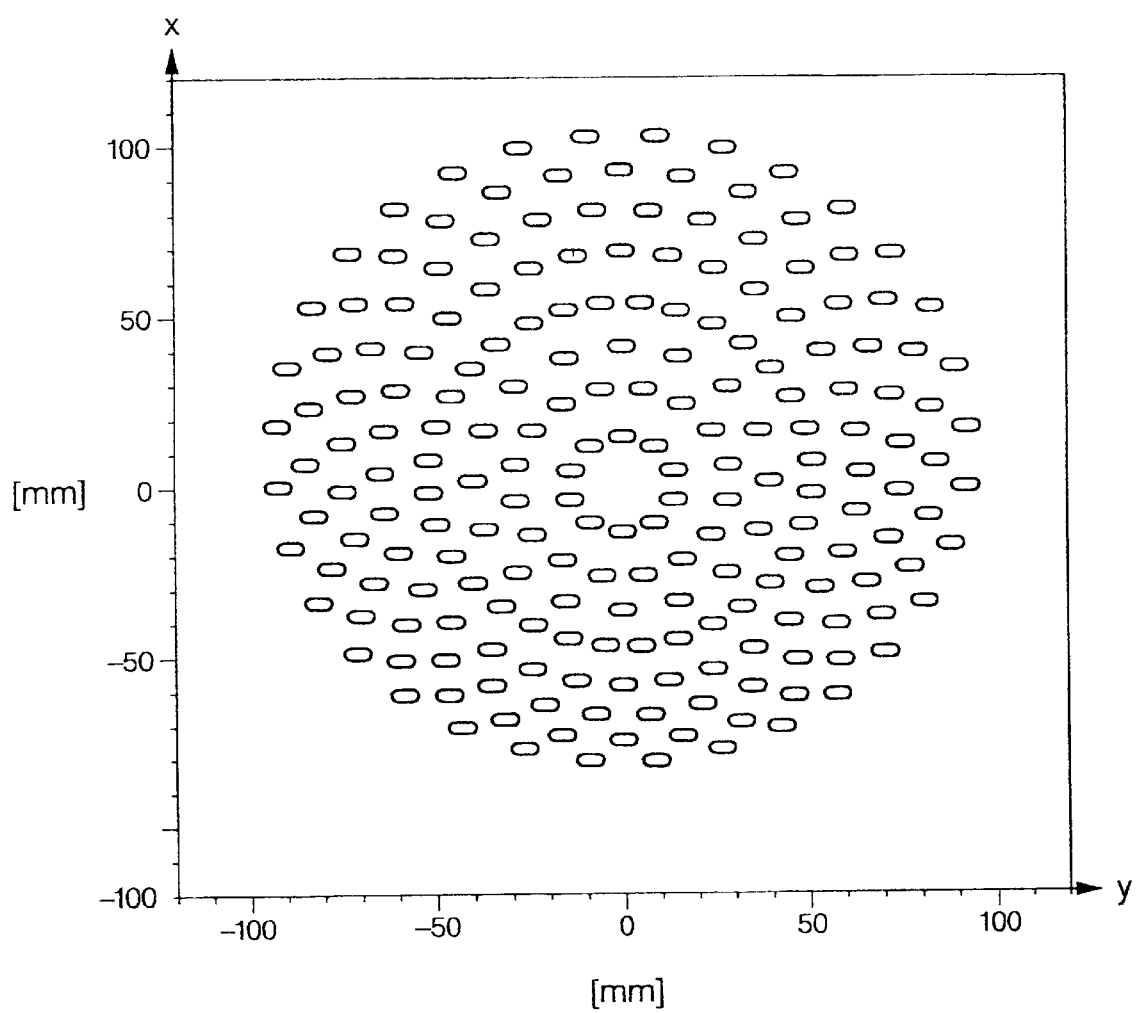
FIG. 3 shows the filling of the pupil raster element with defocusing.

FIG. 3 shows the illumination of the pupil raster element plate with defocused secondary light sources for a spherical light source with a diameter of X=3mm and an assumed aperture of NA~0.09. The etendue remains the same, but a slight deviation from the Köhler illumination has been introduced. In the length direction of the field raster elements, the y-direction, the illumination is clearly elongated, so that the thermal load is drastically reduced. Also, in the short direction, the x-direction, an expansion of the light source images results. The expansion is smaller, however, due to the small angle of aperture. Since the field raster elements have a longer expansion FY in y-direction then FX in x-direction, the angle of aperture in y-direction is greater then in the x-direction, see also in the earlier example where FX×FY=2.8 mm×46 mm the angle of aperture in y-direction is grater then in x-direction.

In a further enhanced form of embodiment, the refractive powers of the field raster elements are adapted to the distances of the corresponding pupil raster elements. As can be seen in FIG. 3, there is more space between the pupil raster elements as compared to the lower half of the second optical component with second raster elements, which take up the respective individual light source images each time, particularly in the outer regions and in the upper half, since the pupil raster elements are arranged on a slightly distorted raster due to the distortion of the imaging optics. Therefore, the sizes of the light source images can be individually influenced by different defocusing, i.e., different focal distances of the individual field raster elements.

Figure 4:
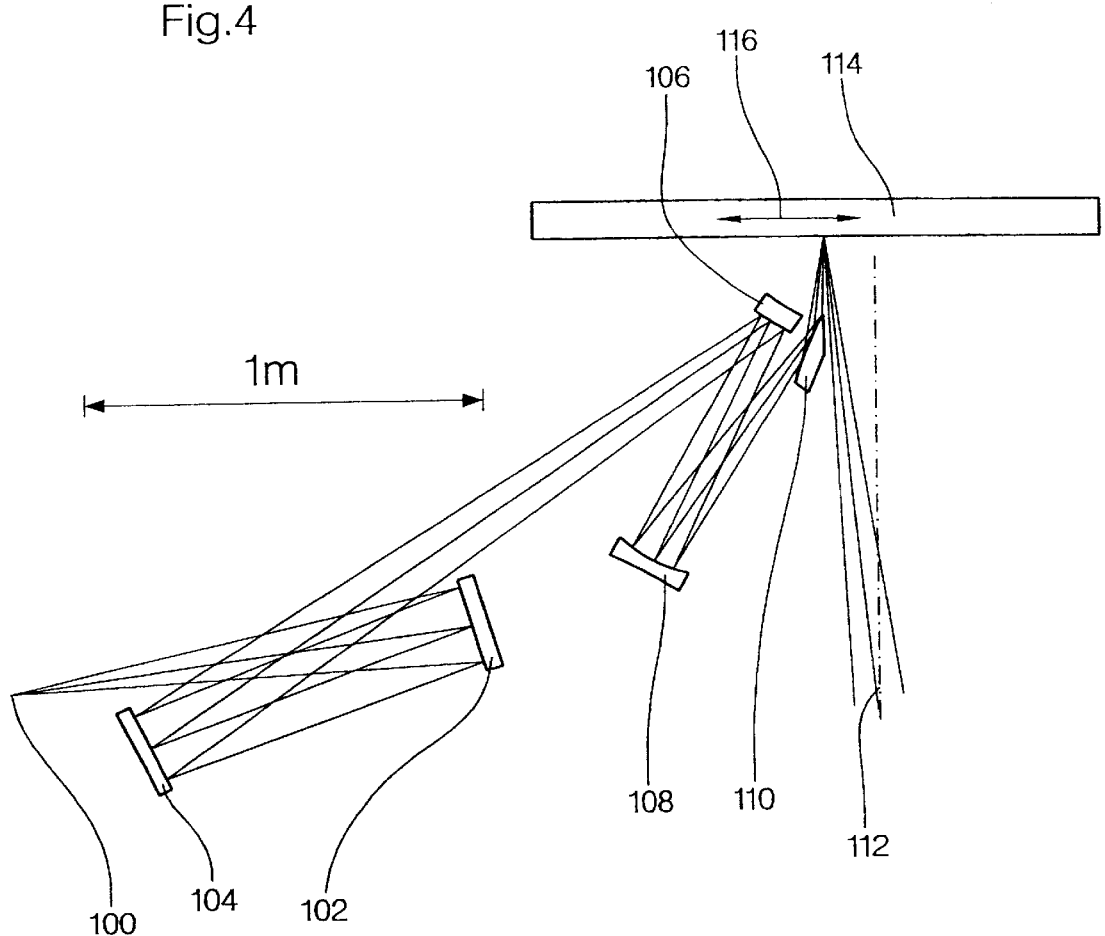
FIG. 4 shows a schematic drawing showing principal components of an illumination system.

FIG. 4 is a schematic diagram of an illumination system, in which the invention can be applied. The illumination system comprises a light source or an intermediate image of a light source 100. The light emitted by the light source or the intermediate image of light source 100, from which only three representative rays are depicted, impinges a mirror 102 with a plurality of first raster elements, so-called field raster elements. Mirror 102 is thus also denoted a field raster element mirror. The refractive power of the individual field raster elements is selected according to the invention such that a defocusing is present, so that the second raster elements, the so-called pupil raster elements of the second optical element 104, lie outside the focal point of the beam bundle produced by the first raster elements. The optical elements 106, 108 and 110, i.e., mirrors, arranged in the light path after the second optical element 104 serve essentially for the purpose of forming a field in a reticle plane 114. The reticle is a reflection mask in the reticle plane 114. The reticle can be moved in the depicted direction 116 in an EUV projection system designed as a scanning system.

Thus, the illumination system of FIG. 4 includes at least one mirror (106, 108, 110), which is arranged in the light path after the second optical element (104). The at least one mirror (106, 108, 110) images a plane, which is arranged in or in the vicinity of the second optical element, in the exit pupil (112).

The exit pupil 112 of the illumination system is illuminated nearly homogeneously by means of the illumination system shown in FIG. 4. The exit pupil 112 coincides with the entrance pupil of a projection objective arranged in the light path after the illumination system. Such a projection objective, for example, with six mirrors, is shown in U.S. patent application Ser. No. 09/503,640, the disclosure content of which is incorporated to the full extent in the present application.

The illumination system of the present invention can be employed in an EUV projection exposure apparatus for microlithography. The illumination system would have an exit pupil that partially collects EUV radiation. The illumination system would guide the EUV radiation for illuminating a ring field. The EUV projection apparatus would include (a) a source of the EUV radiation, (b) the illumination system of the present invention, (c) a pattern-bearing mask on a carrier system, where the pattern-bearing mask lies in a plane of the ring field, (d) a projection device with an entrance pupil that coincides with the exit pupil, where the projection objective images an illuminated part of the pattern-bearing mask in an image field, and (e) a light-sensitive substrate on a carrier system in the plane of the image field. Such an EUV projection exposure apparatus can used for producing a microelectronic component, such as a semiconductor chip.

Figure 5:
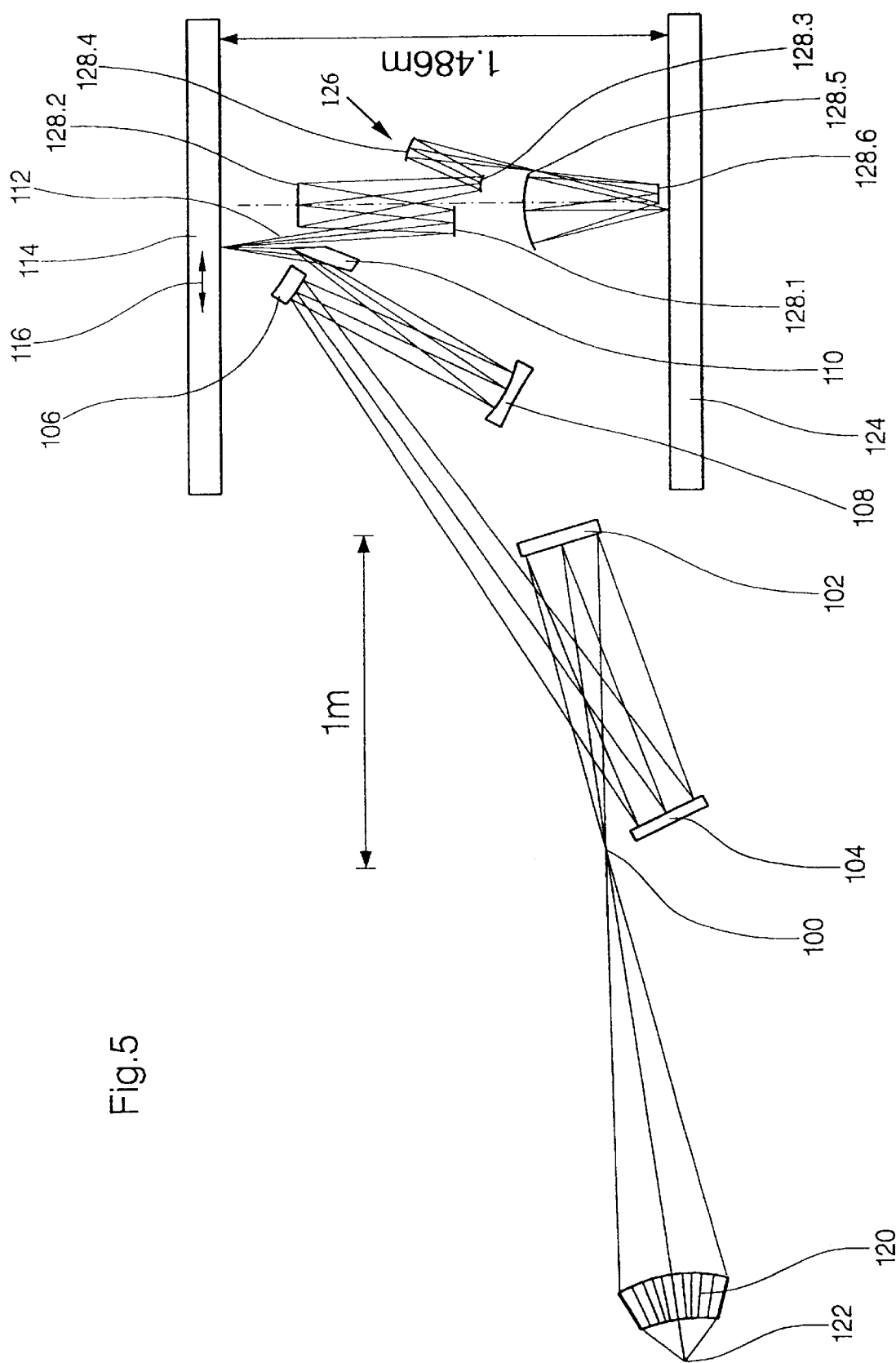
FIG. 5 shows a schematic drawing showing principal components of a projection exposure system.

FIG. 5 shows an optical part of a projection exposure system proceeding from a physical light source 122 up to an object 124 to be exposed. The same components as in FIG. 4 are denoted with the same reference numbers. The system according to FIG. 5 comprises the physical light source 122, a collector unit 120, which is depicted as a nested collector in the embodiment shown in FIG. 5, the illumination system from FIG. 4, a projection objective 126, for example, with six mirrors 128.1, 128.2, 128.3, 128.4, 128.5, 128.6 according to U.S. patent application Ser. No. 09/503,640 as well as the object 124 to be exposed.

The collector unit 120 collects the light of the physical light source 122 and directs the collected light in a light bundle onto the first optical element 102 with raster elements. In FIG. 5 the collector unit 120 is shaped such that a intermediate image of the physical light source 122, the so-called light source 100, is formed. Such a configuration of the collector unit is advantageous, but not necessary.

For the first time, an EUV illumination system is indicated by the invention, with which the thermal load on the second faceted mirror elements is reduced.

It should be understood that various alternatives and modifications of the present invention can be devised by those skilled in the art. The present invention is intended to embrace all such alternatives, modifications and variances that fall within the scope of the appended claims.

What is claimed is:

1. An illumination system for wavelengths ≦193 nm, comprising:

a first raster element upon which a light bundle emitted from a light source impinges, for producing a convergent light bundle having a focal point; and a second raster element, wherein said convergent light bundle impinges on said second raster element outside said focal point.

2. An illumination system for wavelengths ≦193 nm, comprising:

a first plurality of raster elements upon which a light bundle emitted from a light source impinges, for producing a plurality of convergent light bundles, wherein a member of said first plurality of raster elements produces a member of said plurality of convergent light bundles having a focal point; and second plurality of raster elements, wherein said member of said plurality of convergent light bundles impinges on a member of said second plurality of raster elements outside said focal point.

3. The illumination system of claim 2, wherein said member of said plurality of convergent light bundles is characterized by a numerical aperture NA and has a diameter X' at said focal point, wherein said member of said second plurality of raster elements has a diameter D and is characterized by a defocusing Δz, and wherein said defocusing Δz is given by:

$$\frac{0.1D - X'}{2 \cdot NA} < \Delta z < \frac{D - X'}{2 \cdot NA}.$$

4. The illumination system of claim 2, wherein said illumination system is characterized by a distance s from said light source to said first plurality of raster elements, and a distance L from said first plurality of raster elements to said second plurality of raster elements, wherein said light source has a diameter X, wherein said member of said second plurality of raster elements has a diameter D, wherein said member of said first plurality of raster elements is characterized by an extension FY that describes a longer of two extensions of said member of said first plurality of raster elements, and a focal distance f, and wherein said focal distance f lies within the following boundaries:

$$\frac{FY \cdot s \cdot L}{(FY + 0.5D) \cdot s - (FY - X) \cdot L} > f > \frac{FY \cdot s \cdot L}{(FY + D) \cdot s - (FY - X) \cdot L}$$

so that defocusing occurs.

5. The illumination system of claim 2, further comprising a collector unit in a light path before said first plurality of raster elements.

6. The illumination system of claim 2, further comprising a mirror in a light path after said second plurality of raster elements for imaging a plane in an exit pupil.

7. The illumination system of claim 2, further comprising a mirror in a light path after said second plurality of raster elements, wherein said second plurality of raster elements and said mirror image said member of said first plurality of raster elements in an object plane.

8. A projection exposure apparatus for microlithography, comprising:

the illumination system of claim 2, for partially collecting said light bundle and guiding said light bundle for illuminating a ring field;

a pattern-bearing mask on a carrier system, wherein said pattern-bearing mask lies in a plane of said ring field;

a projection device for imaging an illuminated part of said pattern-bearing mask in an image field; and a light-sensitive substrate on a carrier system in said plane of said image field.

9. A method for producing a microelectronic component, comprising using the projection exposure apparatus of claim 8.

10. The illumination system of claim 6, wherein said plane is arranged in or in the vicinity of said second plurality of raster elements.

11. The illumination system of claim 1, wherein said convergent light bundle is characterized by a numerical aperture NA and has a diameter X' at said focal point, wherein said second raster element has a diameter D and is characterized by a defocusing Δz, and wherein said defocusing Δz is given by $$\frac{0.1D - X'}{2 \cdot NA} < \Delta z < \frac{D - X'}{2 \cdot NA}.$$

12. The illumination system of claim 1, wherein said illumination system is characterized by a distance s from said light source to said first raster element, and a distance L from said first raster element to said second raster element, wherein said light source has a diameter X, wherein said second raster element has a diameter D, wherein said first raster element is characterized by an extension FY that describes a longer of two extensions of said first raster element, and a focal distance f, and wherein said focal distance f lies within the following boundaries:

$$\frac{FY \cdot s \cdot L}{(FY + 0.5D) \cdot s - (FY - X) \cdot L} > f > \frac{FY \cdot s \cdot L}{(FY + D) \cdot s - (FY - X) \cdot L}$$

so that defocusing occurs.

13. The illumination system of claim 1, further comprising a collector unit in a light path before said first raster element.

14. The illumination system of claim 1, further comprising a mirror in a light path after a second raster element for imaging a plane in an exit pupil.

15. The illumination system of claim 14, wherein said plane is arranged in or in the vicinity of said second raster element.

16. The illumination system of claim 1, further comprising a mirror in a light path after said second raster element, wherein said second raster element and said mirror image said first raster element in an object plane.

17. A projection exposure apparatus for microlithography comprising:

the illumination system of claim 1, for partially collecting said light bundle and guiding said light bundle for illuminating a ring field;

a pattern-bearing mask on a carrier system, wherein said pattern-bearing mask lies in a plane of said ring field;

a projection device for imaging an illuminated part of said pattern-bearing mask in an image field; and a light-sensitive substrate on a carrier system in said plane of said imaging field.

18. A method for producing a microelectric component comprising using the projection exposure apparatus of claim 17.

* * * * *